US012648218B2

(12) United States Patent 
Fukutani et al.

(10) Patent No.: US 12,648,218 B2 
(45) Date of Patent: Jun. 2, 2026

(54) SEMICONDUCTOR DEVICE

(71) Applicant: DENSO CORPORATION, Kariya-city (JP)

(72) Inventors: Keita Fukutani, Kariya-city (JP); Tasbir Rahman, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 414 days.

(21) Appl. No.: 18/502,456

(22) Filed: Nov. 6, 2023

(65) Prior Publication Data

US 2024/0072045 A1 Feb. 29, 2024

Related U.S. Application Data

(63) Continuation of application No. PCT/JP2022/024840, filed on Jun. 22, 2022.

(30) Foreign Application Priority Data

Jul. 20, 2021 (JP) ................................. 2021-119227

(51) Int. Cl.

| | |
|---|---|
| *H10D 84/80* | (2025.01) |
| *H10D 12/00* | (2025.01) |
| *H10D 30/60* | (2025.01) |
| *H10D 62/10* | (2025.01) |
| *H10D 62/13* | (2025.01) |

(Continued)

(52) U.S. Cl.

CPC ......... *H10D 84/811* (2025.01); *H10D 12/481* (2025.01); *H10D 30/60* (2025.01); *H10D 62/106* (2025.01); *H10D 62/127* (2025.01);

*H10D 62/142* (2025.01); *H10D 64/117* (2025.01); *H10W 70/461* (2026.01)

(58) Field of Classification Search

CPC .. H10D 84/811; H10D 12/481; H10D 62/127; H10D 30/60; H10D 64/117; H10D 62/106; H10D 62/142; H10W 70/461

See application file for complete search history.

(56) References Cited

U.S. PATENT DOCUMENTS

| | | |
|---|---|---|
| 2019/0252374 A1 | 8/2019 | Kanetake et al. |
| 2020/0411653 A1 | 12/2020 | Kamiya et al. |
| 2021/0376167 A1* | 12/2021 | Soneda .................. H10D 8/045 |

(Continued)

*Primary Examiner* — David Vu 
*Assistant Examiner* — Brandon C Fox 
(74) *Attorney, Agent, or Firm* — Posz Law Group, PLC

(57) ABSTRACT

In a semiconductor device, a protective film is disposed above a first surface of a semiconductor substrate. A first main electrode is disposed on the first surface of the semiconductor substrate and has an exposed portion exposed from an opening of the protective film. A second main electrode is disposed on a second surface of the semiconductor substrate. The semiconductor substrate includes an active region formed with IGBTs and diodes connected in antiparallel, as vertical elements. The opening of the protective film corresponds to the active region in a thickness direction. The active region includes an overlapping region overlapping with the exposed portion of the first main electrode, and a non-overlapping region without overlapping with the exposed portion in the thickness direction. A proportion of a diode-formed region in the non-overlapping region is higher than a proportion of a diode-formed region in the overlapping region.

7 Claims, 6 Drawing Sheets

(51) Int. Cl.
H10D 64/00 (2025.01)
H10W 70/40 (2026.01)

(56) References Cited

U.S. PATENT DOCUMENTS

2023/0343862 A1* 10/2023 Harada ................ H10D 64/513
2024/0014206 A1* 1/2024 Osaga ................. H10D 84/811

* cited by examiner

SEMICONDUCTOR DEVICE

CROSS REFERENCE TO RELATED APPLICATIONS

The present application is a continuation application of International Patent Application No. PCT/JP2022/024840 filed on Jun. 22, 2022, which designated the U.S. and claims the benefit of priority from Japanese Patent Application No. 2021-119227 filed on Jul. 20, 2021. The entire disclosures of all of the above applications are incorporated herein by reference.

TECHNICAL FIELD

The present disclosure relates to a semiconductor device.

BACKGROUND

JP 2021-5692 A discloses a semiconductor device having main electrodes on opposite surfaces of a semiconductor substrate. The disclosure of JP 2021-5692 A is incorporated herein by reference as an explanation of technical elements in the present disclosure.

SUMMARY

A semiconductor device according to an aspect of the present disclosure includes a semiconductor substrate, a protective film a first main electrode and a second main electrode. The semiconductor substrate has a first surface and a second surface opposite to the first surface in a thickness direction. The protective film is disposed above the first surface of the semiconductor substrate, and defines an opening. The first main electrode is disposed on the first surface of the semiconductor substrate, and has an exposed portion exposed from the opening of the protective film to provide a bonding region. The second main electrode disposed on the second surface of the semiconductor substrate. The semiconductor substrate includes an active region formed with a plurality of IGBTs to each of which a diode is connected in antiparallel, as vertical elements that allow currents to flow between the first main electrode and the second electrode. The opening is disposed to correspond to the active region in the thickness direction. The active region includes an overlapping region that overlaps with the exposed portion of the first main electrode in the thickness direction, and a non-overlapping region that does not overlap with the exposed portion in the thickness direction. A proportion of a diode-formed region in the non-overlapping region is higher than a proportion of a diode-formed region in the overlapping region.

DETAILED DESCRIPTION

Figure 1:
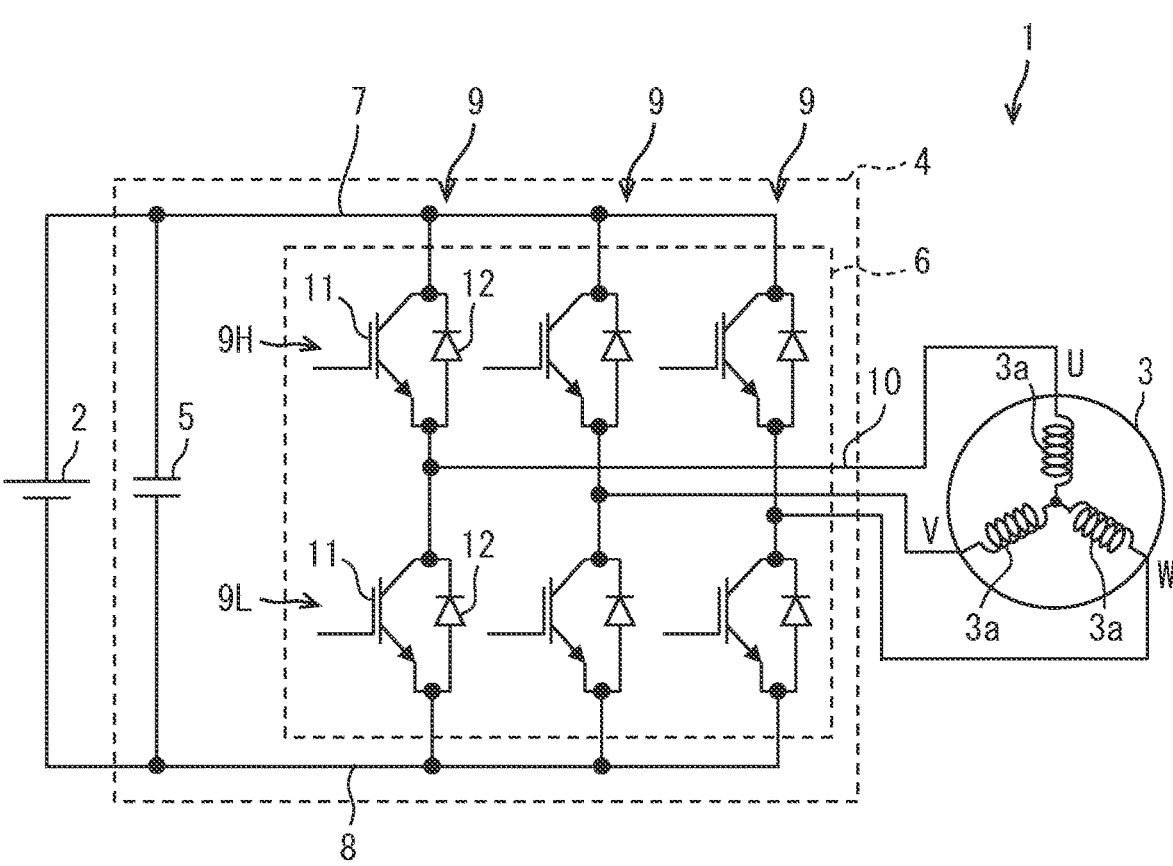
FIG. 1 is a schematic diagram illustrating a configuration of a vehicle drive system to which a semiconductor device according to a first embodiment is applied.

There has been known a semiconductor device in which an active region in which elements are formed is extended to a position outside of a region below a terminal. In such a semiconductor device, the elements are provided such that the current density in an extended region extended outside of the region below the terminal is lower than the current density in the region below the terminal when the switching elements in the extended region and the switching elements in the region below the terminal are turned on. Thus, the current density in the extended region is lower. From the above-described viewpoint or from other viewpoints not mentioned, further improvement is required for the semiconductor device.

The present disclosure provides a semiconductor device which is capable of enhancing an effect of an enlargement of an active region.

According to an aspect of the present disclosure, a semiconductor device includes: a semiconductor substrate having a first surface and a second surface opposite to the first surface in a thickness direction; a protective film disposed above the first surface of the semiconductor substrate, and defining an opening; a first main electrode disposed on the first surface of the semiconductor substrate, and having an exposed portion exposed from the opening of the protective film to provide a bonding region; and a second main electrode disposed on the second surface of the semiconductor substrate. The semiconductor substrate includes an active region formed with a plurality of IGBTs to each of which a diode is connected in antiparallel, as vertical elements that allow currents to flow between the first main electrode and the second electrode. The opening of the protective film is disposed to correspond to the active region in the thickness direction. The active region includes an overlapping region that overlaps with the exposed portion of the first main electrode in the thickness direction, and a non-overlapping region that does not overlap with the exposed portion in the thickness direction. A proportion of a diode-formed region in the non-overlapping region is higher than a proportion of a diode-formed region in the overlapping region.

In such a configuration, the active region includes the overlapping region and the non-overlapping region. In other words, the active region is enlarged. Further, the proportion of the diode-formed region in the non-overlapping region is higher than the proportion of the diode-formed region in the overlapping region.

The proportion of an IGBT-formed region in the overlapping region is increased by the increase in the proportion of the diode-formed region in the non-overlapping region. However, heat generated during operation of the IGBTs can be released from the exposed portion of the first main electrode to an object to be bonded to the exposed portion. Since the proportion of the diode-formed region is increased in the non-overlapping region, it is possible to suppress the temperature of the non-overlapping region from being higher than the temperature of the overlapping region. That is, it is possible to suppress a situation that the IGBTs need to be turned off due to the temperature rise of the non-overlapping region. As a result, the effect of the enlargement of the active region can be enhanced.

The disclosed aspects in this specification adopt different technical solutions from each other in order to achieve their respective objects. The objects, features, and advantages disclosed in this specification will become apparent by referring to following detailed descriptions and accompanying drawings.

Hereinafter, multiple embodiments will be described with reference to the drawings. The same or corresponding elements are designated with the same reference numerals throughout the embodiments, and descriptions thereof will not be repeated. When only part of the configuration is described in each embodiment, the other parts of the configuration can be provided by those of the preceding embodiment(s). Further, not only the combinations of the configurations explicitly shown in the description of the respective embodiments, but also the configurations of the multiple embodiments can be partially combined even when they are not explicitly shown as long as there is no difficulty in the combination in particular.

A semiconductor device according to an embodiment of the present disclosure is, for example, applied to an electric power conversion device for a movable body that uses a rotary electric machine as a drive source. The movable body is, for example, an electric vehicle such as an electric vehicle (EV), a hybrid vehicle (HV), or a plug-in hybrid vehicle (PHV), a flying object such as a drone, a ship, a construction machine, or an agricultural machine. Hereinafter, examples of the semiconductor device applied to a vehicle will be described.

First Embodiment

Firstly, a schematic configuration of a drive system of a vehicle will be described with reference to FIG. 1.

<Vehicle Drive System>

As shown in FIG. 1, a vehicle drive system 1 is provided with a direct current (DC) power supply 2, a motor generator 3, and an electric power conversion device 4.

The DC power supply 2 is a direct-current voltage source including a chargeable/dischargeable secondary battery. Examples of the secondary battery includes a lithium ion battery and a nickel hydride battery. The motor generator 3 is a three-phase alternating current (AC) type rotary electric machine. The motor generator 3 functions as a vehicle driving power source, that is, an electric motor. The motor generator 3 functions also as a generator during regeneration. The electric power conversion device 4 performs electric power conversion between the DC power supply 2 and the motor generator 3.

<Electric Power Conversion Device>

Next, a circuit configuration of the electric power conversion device 4 will be described with reference to FIG. 1. The electric power conversion device 4 includes a smoothing capacitor 5 and an inverter 6.

The smoothing capacitor 5 mainly smoothes the DC voltage supplied from the DC power supply 2. The smoothing capacitor 5 is connected between a P line 7 which is a power line on a high potential side and an N line 8 which is a power line on a low potential side. The P line 7 is connected to a positive electrode of the DC power supply 2, and the N line 8 is connected to a negative electrode of the DC power supply 2. A positive electrode of the smoothing capacitor 5 is connected to the P line 7 at a position between the DC power supply 2 and the inverter 6. Similarly, a negative electrode of the smoothing capacitor 5 is connected to the N line 8 at a position between the DC power supply 2 and the inverter 6. The smoothing capacitor 5 is connected to the DC power supply 2 in parallel.

The inverter 6 corresponds to a DC-AC conversion circuit. The inverter 6 converts the DC voltage into a three-phase alternating current (AC) voltage according to a switching control by a control circuit (not shown) and outputs the three-phase AC voltage to the motor generator 3. Thus, the motor generator 3 is driven to generate a predetermined torque. At the time of regenerative braking of the vehicle, the inverter 6 converts the three-phase AC voltage, which is generated by the motor generator 3 by receiving the rotational force from wheels, into a DC voltage according to the switching control by the control circuit, and outputs the DC voltage to the P line 7. In this way, the inverter 6 performs bidirectional power conversion between the DC power supply 2 and the motor generator 3.

The inverter 6 includes upper-lower arm circuits 9 for three phases. Each of the upper-lower arm circuits 9 may be referred to as a "leg". Each of the upper-lower arm circuits 9 includes an upper arm 9H and a lower arm 9L. The upper arm 9H and the lower arm 9L are connected in series between the P line 7 and the N line 8 with the upper arm 9H on the P line 7 side. A connection point between the upper arm 9H and the lower arm 9L is connected to a winding 3a of a corresponding phase of the motor generator 3 via an output line 10. The inverter 6 has six arms. At least a part of each of the P line 7, the N line 8 and the output line 10 is made of a conductive member such as a bus bar.

The elements constituting each arm include an insulated gate bipolar transistor 11 (hereinafter referred to as IGBT 11), which is a switching element, and a diode 12 for reflux. In the present embodiment, the switching element is an n-channel type IGBT 11. The diode 12 is connected in antiparallel to the corresponding IGBT 11. In the upper arm 9H, a collector of the IGBT 11 is connected to the P line 7. In the lower arm 9L, an emitter of the IGBT 11 is connected to the N line 8. An emitter of the IGBT 11 of the upper arm 9H and a collector of the IGBT 11 of the lower arm 9L are connected to each other. An anode of the diode 12 is connected to the emitter of the corresponding IGBT 11, and the cathode of the diode 12 is connected to the collector of the corresponding IGBT 11.

The electric power conversion device 4 may further include a converter as a power conversion circuit. The converter is a DC-DC converter circuit for converting the DC voltage to a DC voltage with a different value. The converter is disposed between the DC power supply 2 and the smoothing capacitor 5. The converter is configured to include, for example, a reactor and the upper-lower arm circuits 9 described above. In such a configuration, the voltage can be stepped up or down. The electric power conversion device 4 may include a filter capacitor that removes power supply noise from the DC power supply 2. The filter capacitor is disposed between the DC power supply 2 and the converter.

The electric power conversion device 4 may include a drive circuit for driving the switching elements of the inverter 6 and the like. The drive circuit supplies a drive voltage to a gate of the IGBT 11 of the corresponding arm based on a drive command of the control circuit. The drive circuit drives the corresponding IGBT 11, that is, turns on and off the corresponding IGBT 11 by applying the drive voltage. The drive circuit may be referred to as a "driver".

The electric power conversion device 4 may include a control circuit for the switching elements. The control circuit generates a drive command for operating the IGBT 11 and outputs the drive command to the drive circuit. The control circuit generates the drive command based on a torque request input from a higher-level ECU (not shown) or signals detected by various sensors. Examples of the various sensors include a current sensor, a rotation angle sensor, and a voltage sensor. The current sensor detects a phase current flowing through the winding 3a of each phase. The rotation angle sensor detects the rotation angle of a rotor of the motor generator 3. The voltage sensor detects the voltage across the smoothing capacitor 5. The control circuit outputs, for example, a PWM signal as the drive command. The control circuit includes, for example, a processor and a memory. ECU is an abbreviation for Electronic Control Unit. PWM is an abbreviation for Pulse Width Modulation.

<Semiconductor Device>

Figure 2:
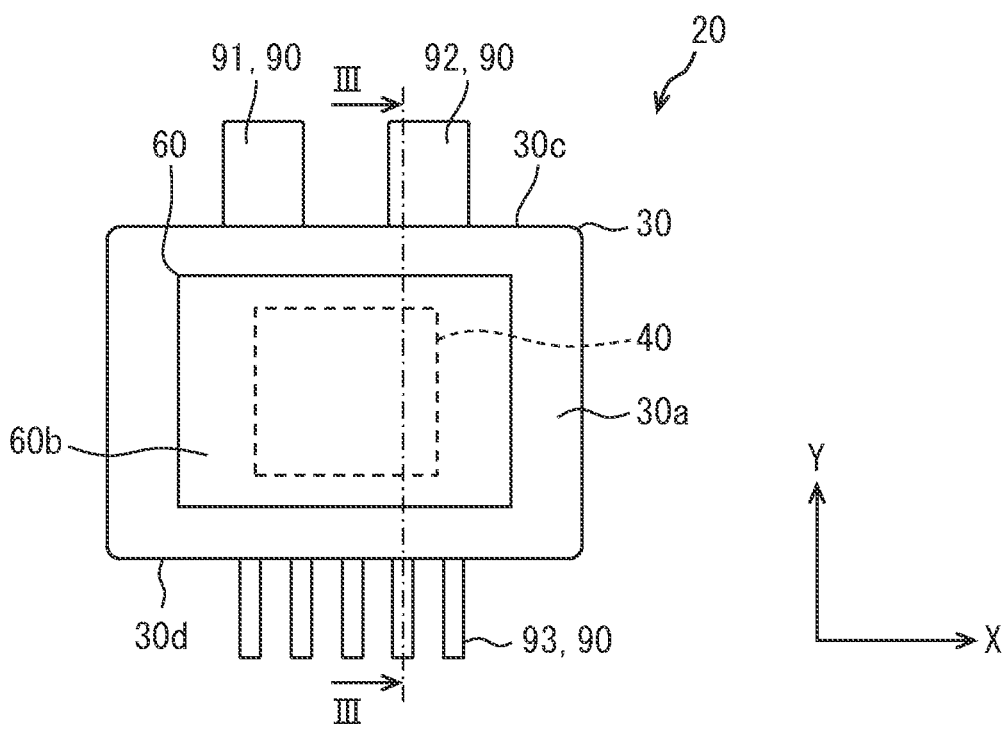
FIG. 2 is a plan view of the semiconductor device according to the first embodiment.
Figure 3:
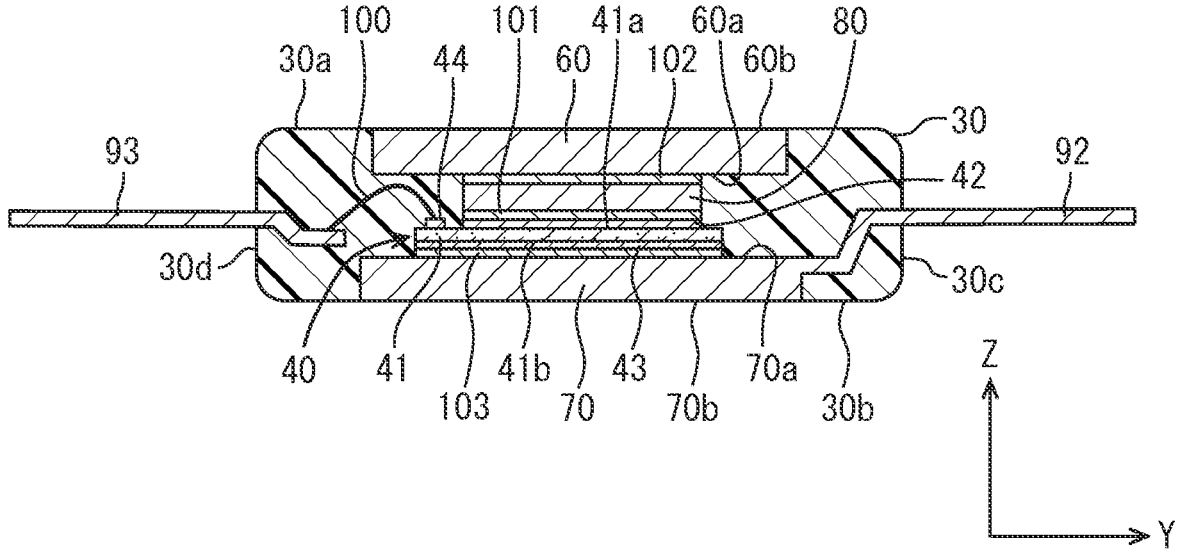
FIG. 3 is a cross-sectional view taken along a line III-III in FIG. 2.

Next, a schematic configuration of a semiconductor device having a semiconductor element will be described with reference to FIGS. 2 and 3. FIG. 2 is a plan view of the semiconductor device. FIG. 2 is a top plan view, when the semiconductor device is viewed from the top. FIG. 3 is a cross-sectional view taken along a line III-III in FIG. 2. In FIG. 3, the structure of the semiconductor element is illustrated in a simplified manner.

Hereinafter, a direction along a thickness of a semiconductor substrate, that is, a thickness direction of the semiconductor substrate is defined as a Z direction. One direction orthogonal to the Z direction is defined as an X direction. A direction orthogonal to both the Z direction and the X direction is defined as a Y direction. Unless otherwise specified, a shape in a plan view viewed in the Z direction, that is, a shape along an XY plane including the X direction and Y direction is referred to as a planar shape. A plan view in the Z direction is simply referred to as the plan view.

As shown in FIGS. 2 and 3, a semiconductor device 20 includes a sealing resin body 30, a semiconductor element 40, heat sinks 60 and 70, a conductive spacer 80, and an external connection terminal 90. The semiconductor device 20 constitutes one of the arms described above. That is, the two semiconductor devices 20 form the upper-lower arm circuit 9 for one phase.

The sealing resin body 30 seals a part of each of other elements constituting the semiconductor device 20. A remaining part of each of other elements is exposed to the outside of the sealing resin body 30. The sealing resin body 30 is made of, for example, an epoxy-based resin. The sealing resin body 30 is formed by, for example, a transfer molding method. As shown in FIG. 2, the sealing resin body 30 has a substantially rectangular shape as the planar shape. The sealing resin body 30 has a first surface 30a as one surface and a second surface 30b as a back surface, which are opposite in the Z direction. The first surface 30a and the second surface 30b are, for example, flat surfaces.

The semiconductor element 40 includes a semiconductor substrate 41, an emitter electrode 42, a collector electrode 43, and pads 44. The semiconductor element 40 may be also referred to as a semiconductor chip. The semiconductor substrate 41 is formed of a material such as silicon (Si) or a wide bandgap semiconductor having a bandgap wider than that of silicon. The semiconductor substrate 41 is formed with a vertical element. Examples of the wide bandgap semiconductor include silicon carbide (SiC), gallium nitride (GaN), gallium oxide ($Ga_2O_3$) and diamond.

The vertical element is configured to cause a main current to flow in the thickness direction of the semiconductor substrate 41 (semiconductor element 40), that is, in the Z direction. The vertical element of the present embodiment is the IGBT 11 and the diode 12 constituting one arm. The vertical element is the IGBT to which the diode 12 is connected in antiparallel, that is, a reverse conducting (RC)-IGBT. The vertical element is a heat generating element that generates heat when energized. The semiconductor substrate 41 is formed with a gate electrode (not shown). The gate electrode has, for example, a trench structure.

The semiconductor substrate 41 has a first surface 41a as one surface and a second surface 41b as a back surface. The first surface 41a and the second surface 41b are plate surfaces on which main electrodes are provided. In the semiconductor substrate 41, the first surface 41a is on a side adjacent to the first surface 30a of the sealing resin body 30. The second surface 41b is a surface opposite to the first surface 41a in the thickness direction. The emitter electrode 42, which is one of the main electrodes, is disposed on the first surface 41a of the semiconductor substrate 41. The collector electrode 43, which is another one of the main electrodes, is disposed on the second surface 41b of the semiconductor substrate 41. The emitter electrode 42 corresponds to a first main electrode, and the collector electrode 43 corresponds to a second main electrode.

When the IGBT 11 is turned on, a current (main current) flows between the main electrodes, that is, between the emitter electrode 42 and the collector electrode 43. The emitter electrode 42 also serves as an anode electrode of the diode 12. The collector electrode 43 also serves as a cathode electrode of the diode 12. The collector electrode 43 is formed on almost the entire second surface 41b of the semiconductor substrate 41. The emitter electrode 42 is formed on a part of the first surface 41a of the semiconductor substrate 41.

The pads 44 serve as electrodes for signals. The pads 44 are formed in a region different from a formation region where the emitter electrode 42 is formed on the first surface 41a of the semiconductor substrate 41. The pads 44 are formed at an end on a side opposite to the formation region of the emitter electrode 42 in the Y direction. The pads 44 are arranged side by side with the emitter electrode 42 in the Y direction. The pads 44 include at least a pad for a gate electrode. Details of the semiconductor element 40 will be described later.

The heat sinks 60 and 70 are metal plates made of a metal having favorable conductivity such as copper (Cu) or Cu alloy. The heat sinks 60 and 70 are arranged so as to interpose the semiconductor elements 40 therebetween in the Z direction. The heat sinks 60 and 70 are disposed so as to face each other at least at a part in the Z direction. The heat sinks 60 and 70 enclose the semiconductor element 40 in the plan view.

The heat sink 60 is electrically connected to the emitter electrode 42 and provides a wiring function. Similarly, the heat sink 70 is electrically connected to the collector electrode 43 and provides a wiring function. The heat sinks 60 and 70 each provide a heat dissipation function of dissipating heat generated by the semiconductor element 40. Each of the heat sinks 60 and 70 may have a plating film of nickel (Ni), gold (Au), or the like on a surface thereof. The heat sink 60 of the present embodiment is electrically connected to the emitter electrode 42 via a conductive spacer 80. The heat sink 60 and the conductive spacer 80 correspond to a first wiring member. The heat sink 70 corresponds to a second wiring member.

The heat sink 60 includes a facing surface 60a facing the semiconductor element 40, and a back surface 60b opposite to the facing surface 50a. Similarly, the heat sink 70 also has a facing surface 70a and a back surface 70b. Each of the heat sinks 60 and 70 has a substantially rectangular shape as the planar shape. The back surfaces 60b and 70b of the heat sinks 60 and 70 are exposed from the sealing resin body 30. The back surfaces 60b and 70b may be referred to as heat dissipation surfaces, exposed surfaces, or the like. The back surface 60b of the heat sink 60 is substantially flush with the first surface 30a of the sealing resin body 30. The back surface 70b of the heat sink 70 is substantially flush with the second surface 30b of the sealing resin body 30.

The conductive spacer 80 is interposed between semiconductor element 40 and the heat sink 60. The conductive spacer 80 provides a spacer function of securing a predetermined distance between the semiconductor element 40 and the heat sink 60. For example, the conductive spacer 80 secures a height for allowing the electrical connection of signal terminals 93 to the corresponding pads 44 of the semiconductor element 40. The conductive spacer 80 is located at an intermediate position on an electrical conduction and thermal conduction path between the emitter electrode 42 of the semiconductor element 40 and the heat sink 60, and provides a wiring function and a heat dissipation function.

The conductive spacer 80 includes a metal material having favorable electrical conductivity and thermal conductivity such as copper (Cu). The conductive spacer 80 may include a plating film on a surface thereof. The conductive spacer 80 may be referred to as a terminal, a terminal block, a metal block, or the like. The semiconductor device 20 includes the conductive spacers 80 whose number is the same as the number of the semiconductor elements 40. The conductive spacers 80 are individually connected to the semiconductor elements 40. The conductive spacer 80 is, for example, a columnar body having a substantially rectangular planar shape. The conductive spacer 80 has a size substantially equal to or slightly smaller than an exposed portion 421, which will be described later, in the plan view.

The external connection terminal 90 is a terminal for electrically connecting the semiconductor device 20 to an external device. The external connection terminal 90 is formed using a metal material having good conductivity such as copper. The external connection terminal 90 is, for example, a plate member. The external connection terminal 90 may be referred to as a "lead". The external connection terminal 90 includes main terminals 91 and 92 and a signal terminal 93. Each of the main terminals 91 and 92 is the external connection terminal 90 electrically connected to the corresponding main electrode of the semiconductor element 40.

The main terminal 91 is electrically connected to the emitter electrode 42. The main terminal 91 may be referred to as an emitter terminal. The main terminal 91 is connected to the emitter electrode 42 via the heat sink 60. The main terminal 91 connects to one end of the heat sink 60 in the Y direction. The thickness of the main terminal 91 is smaller than that of the heat sink 60. The main terminal 91 connects to the heat sink 60 so as to be substantially flush with the facing surface 60a, for example. The main terminal 91 and the heat sink 60 may be provided by an integral member, so that the main terminal 91 connects to the heat sink 60. Alternatively, the main terminal 91 and the heat sink 60 may be provided by separate members, and be bonded to each other so that the main terminal 91 connects to the heat sink 60.

The main terminal 91 of the present embodiment is provided integrally with the heat sink 60 as a part of the lead frame. The main terminal 91 extends from the heat sink 60 in the Y direction and protrudes to the outside from a side surface 30c of the sealing resin body 30. The main terminal 91 has a bent portion at a position covered with the sealing resin body 30, and protrudes from the vicinity of the center in the Z direction on the side surface 30c.

The main terminal 92 is electrically connected to the collector electrode 43. The main terminal 92 may be referred to as a collector terminal. The main terminal 92 is connected to the collector electrode 43 via the heat sink 70. The main terminal 92 connects to an end of the heat sink 70 in the Y direction. The thickness of the main terminal 92 is smaller than that of the heat sink 70. The main terminal 92 connects to the heat sink 70 so as to be substantially flush with the facing surface 70a, for example. The main terminal 92 and the heat sink 70 may be provided by an integral member, so that the main terminal 92 connects to the heat sink 70. Alternatively, the main terminal 92 and the heat sink 70 may be provided by separate members, and be bonded to each other so that the main terminal 92 connects to the heat sink 70.

The main terminal 92 of the present embodiment is provided integrally with the heat sink 70 as a part of a lead frame separate from the main terminal 91. The main terminal 92 extends from the heat sink 70 in the Y direction and protrudes to the outside from the same side surface 30c as the main terminal 91. The main terminal 92 has a bent portion at a position covered with the sealing resin body 30, and protrudes from the vicinity of the center in the Z direction on the side surface 30c. The two main terminals 91 and 92 are arranged side by side in the X direction so that side surfaces thereof face each other.

The signal terminal 93 is electrically connected to the pad 44 of the semiconductor element 40. In the present embodiment, the signal terminal 93 is electrically connected to the pad 44 through a bonding wire 100. The signal terminal 93 extends in the Y direction and protrudes to the outside from a side surface 30d of the sealing resin body 30. The side surface 30d is a surface opposite to the side surface 30c in the Y direction. The semiconductor device 20 of the present embodiment has five signal terminals 93 corresponding to the pads 44. The signal terminals 93 are formed in a lead frame common to the heat sink 70 and the main terminal 92, for example. The multiple signal terminals 93 are electrically separated from each other as a result of cutting a tie bar (not shown).

The emitter electrode 42 of the semiconductor element 40 is bonded to the conductive spacer 80 via a bonding material 101. The conductive spacer 80 is bonded to the heat sink 60 via a bonding material 102. The collector electrode 43 of the semiconductor element 40 is bonded to the heat sink 70 via a bonding material 103. The bonding materials 101 to 103 have conductivity. For example, the bonding materials 101, 102 and 103 each can be provided by solder. An example of the solder is a multicomponent lead-free solder containing copper (Cu), nickel (Ni), and the like in addition to tin (Sn). Instead of the solder, a sintered bonding member such as sintered silver may be used as the bonding material. The bonding materials 101, 102 and 103 may be provided by a same material or different materials. In the present embodiment, solder is used as the bonding materials 101, 102, and 103.

In the semiconductor device 20, as described above, the semiconductor element 40 constituting one arm is sealed by the sealing resin body 30. The sealing resin body 30 integrally seals the semiconductor element 40, a part of the heat sink 60, a part of the heat sink 70, the conductive spacer 80, and a part of each of the external connection terminals 90.

The semiconductor element 40 is arranged between the heat sink 60 and the heat sink 70 in the Z direction. The semiconductor element 40 is sandwiched between the heat sink 60 and the heat sink 70 that are arranged to face each other. Therefore, the heat of the semiconductor element 40 can be dissipated on both sides in the Z direction. The semiconductor device 20 has a double-sided heat dissipation structure. The back surface 60b of the heat sink 60 is substantially flush with the first surface 30a of the sealing resin body 30. The back surface 70b of the heat sink 70 is substantially flush with the second surface 30b of the sealing resin body 30. Since the back surfaces 60b, 70b are exposed surfaces, it is possible to enhance the heat dissipation.

<Semiconductor Element>

Figure 4:
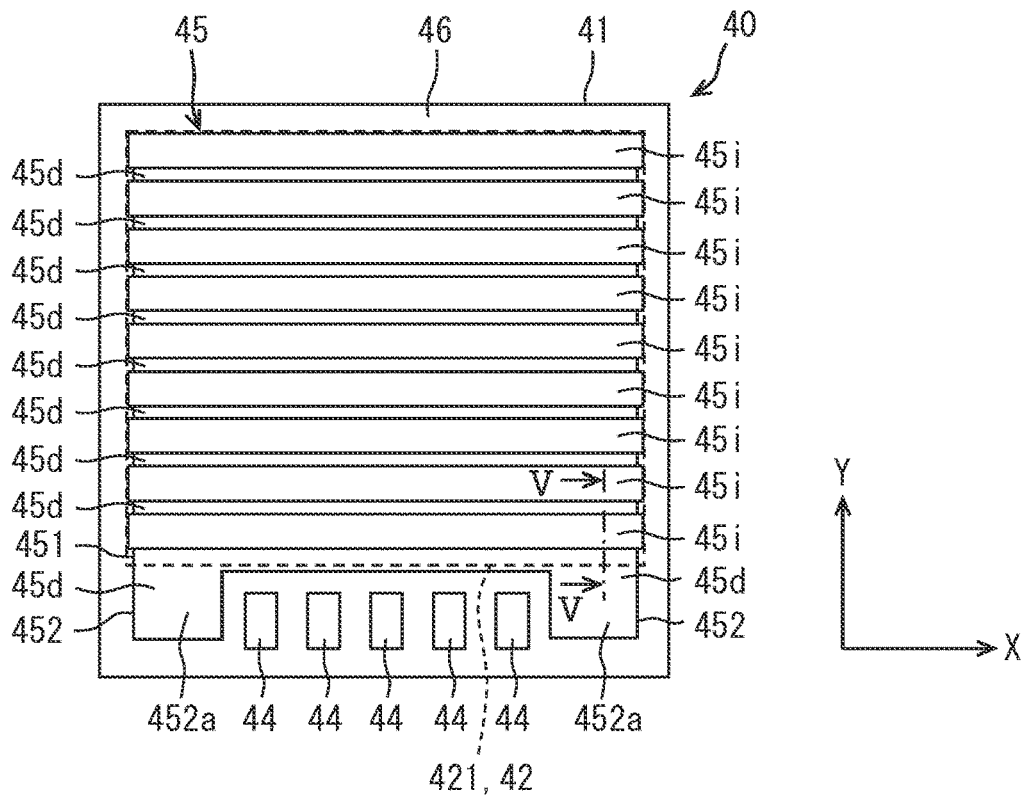
FIG. 4 is a plan view of a semiconductor element of the semiconductor device according to the first embodiment.
Figure 5:
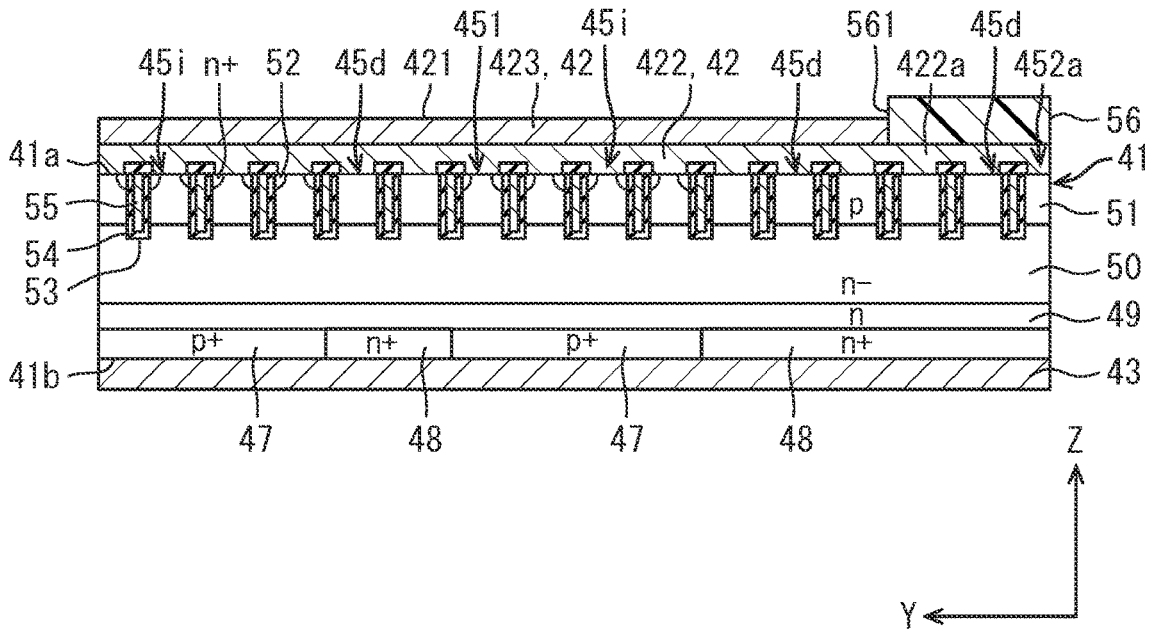
FIG. 5 is a cross-section view taken along a line V-V in FIG. 4.

Next, the semiconductor element 40 will be described with reference to FIGS. 4 and 5. FIG. 4 is a plan view of the semiconductor element 40 on the first surface side. For convenience, in FIG. 4, an active region including IGBT regions and diode regions is indicated by a solid line. FIG. 5 is a cross-sectional view taken along a line V-V in FIG. 4. Hereinafter, "inner side" or "outer side" refer to a relative positional relationship with the center of the active region of the semiconductor element as a reference position. The side closer to the center is the inner side, and the side farther from the center is the outer side.

As shown in FIG. 4, the semiconductor substrate 41 has a substantially rectangular shape as the planar shape. The semiconductor substrate 41 has an active region 45. The active region 45 is a formation region of the vertical elements. The active region 45 may be referred to as a main region, a main cell region, a cell region, an element region, an element-formed region, or the like. The active region 45 includes an IGBT region 45i, which is a formation region of the IGBT of the RC-IGBT and will be referred to as the IGBT-formed region, and a diode region 45d, which is a formation region of the diode of the RC-IGBT and will be referred to as the diode-formed region. The active region 45 has multiple IGBT regions 45i and diode regions 45d, and the IGBT regions 45i and the diode regions 45d are alternately arranged in the Y direction. The active region 45 is provided with a plurality of cells (unit structures). The plurality of cells are connected in parallel to each other, thereby to form the RC-IGBT.

The semiconductor substrate 41 has an outer peripheral region 46 surrounding the active region 45. The outer peripheral region 46 is a region outside the outer peripheral end of the active region 45 in the plan view. Although not illustrated, a high withstand voltage structure portion such as a guard ring is formed in the outer peripheral region 46.

As shown in FIG. 5, the semiconductor substrate 41 includes a collector region 47, a cathode region 48, a buffer region 49, a drift region 50, a base region 51, and an emitter region 52. In the semiconductor substrate 41, respective semiconductor regions are formed by ion-implantation of impurities. The semiconductor regions may be referred to as semiconductor layers, diffusion layers, or the like.

The collector region 47 is formed in a surface layer on the second surface 41b side of the semiconductor substrate 41. The collector region 47 is a p-conductivity type (e.g., p+) semiconductor region having an impurity concentration higher than that of the base region 51. The cathode region 48 is also formed in the surface layer on the second surface 41b side of the semiconductor substrate 41. The cathode region 48 is an n-conductivity type (e.g., n+) semiconductor region having an impurity concentration higher than that of the drift region 50. The cathode region 48 is arranged side by side with the collector region 47 on the XY plane. The collector region 47 is provided in the IGBT region 45i, and the cathode region 48 is provided in the diode region 45d. The cathode regions 48 are arranged alternately with the collector regions 47 in the Y direction.

The buffer region 49 is formed on surfaces of the collector regions 47 and the cathode regions 48 opposite to the second surface 41b. The buffer region 49 is formed between the collector regions 47 and cathode regions 48 and the drift region 50. The buffer region 49 is an n-conductivity type (e.g., n) semiconductor region having an impurity concentration lower than that of the cathode regions 48 and higher than that of the drift region 50. Since the semiconductor substrate 41 has the buffer region 49, it is possible to suppress the depletion layer from expanding to the collector region 47.

The drift region 50 is formed on a surface of the buffer region 49 on a side opposite to the collector region 47. The drift region 50 is an n-conductivity type (e.g., n−) semiconductor region having an impurity concentration lower than that of the buffer region 49.

The base region 51 is formed on a surface of the drift region 50 opposite to the buffer region 49. The base region 51 is a p-conductivity type (e.g., p) semiconductor region having an impurity concentration lower than that of the collector region 47. The base region 51 is provided mainly in the active region 45 of the semiconductor substrate 41. The base region 51 is formed in the surface layer of the semiconductor substrate 41 adjacent to the first surface 41a. The base region 51 may be referred to as a channel region. When the n-conductivity type is referred to as a first conductivity type, the p-conductivity type is referred to as a second conductivity type.

The emitter region 52 is provided in the surface layer of the base region 51 adjacent to the first surface 41a. The emitter region 52 is an n-conductivity type (e.g., n+) semiconductor region having an impurity concentration higher than that of the drift region 50. The emitter region 52 is formed in the IGBT region 45i of the active region 45. The emitter region 52 is provided so as to be in contact with a side surface of a trench 53, which will be described later, in the IGBT region 45i.

The semiconductor substrate 41 described above is formed with trenches 53. The trench 53 is formed to have a predetermined depth from the first surface 41a. The trench 53 penetrates the base region 51. An end of the trench 53 reaches the drift region 50. Multiple trenches 53 are formed in the active region 45 of the semiconductor substrate 41. Each of the trenches 53 extends in the X direction. The trenches 53 are arranged at substantially equal intervals in the Y direction, and form a stripe shape in the plan view. The trench 53 defines a cell. Each of the cells includes one trench 53, and the multiple cells are arranged in parallel in the Y direction.

A gate insulating film 54 is formed on a wall surface of each trench 53. A gate electrode 55 is formed on a surface of the gate insulating film 54 so as to fill the trench 53. The gate electrode 55 penetrates the base region 51 and reaches the drift region 50. Multiple gate electrodes 55 are formed in the active region 45 of the semiconductor substrate 41. Each of the gate electrodes 55 extends in the X direction. The gate electrodes 55 are arranged at substantially equal intervals in the Y direction and have a stripe shape in the plan view.

The emitter electrode 42 is disposed on the first surface 41*a* of the semiconductor substrate 41. The emitter electrode 42 is disposed mainly on the active region 45. The emitter electrode 42 is electrically connected to the emitter regions 52 and the base region 51. The emitter electrode 42 is electrically isolated from the gate electrodes 55. The emitter electrode 42 may be electrically connected to the base region 51 via a base contact region. The base contact region is provided in a surface layer of the base region 51 adjacent to the first surface 41*a*. The base contact region is provided adjacent to the emitter region 52. The base contact region is a p-conductivity type (e.g., p+) semiconductor region having an impurity concentration higher than that of the base region 51.

The pads 44 serving as signal electrodes are also disposed on the first surface 41*a* of the semiconductor substrate 41. The semiconductor element 40 of the present embodiment has five pads 44. Specifically, the five pads 44 include pads for a gate electrode, a Kelvin emitter for detecting an emitter potential of the IGBT12, a current sense, an anode potential of a temperature sensitive diode (temperature sensitive element) for detecting a temperature of the semiconductor element 40, and a cathode potential. The pad 44 for the Kelvin emitter is electrically connected to the emitter electrode 42. The other pads 44 are electrically isolated from the emitter electrode 42. The five pads 44 are collectively disposed adjacent to one end of the semiconductor substrate 41, which has the substantially rectangular planar shape, in the Y direction, and are arranged side by side in the X direction. The five pads 44 are arranged near the center of the side of the semiconductor substrate 41 along the X direction.

The collector electrode 43 is formed on the second surface 41*b* of the semiconductor substrate 41. The collector electrode 43 is formed in substantially the entire region of the second surface 41*b*. The collector electrode 43 is electrically connected to the collector regions 47 and the cathode regions 48.

In the semiconductor element 40 described above, each cell of the IGBT region 45*i* is formed with an IGBT structure portion. The IGBT structure portion is configured to include the collector region 47, the buffer region 49, the drift region 50, the base region 51, the emitter region 52, and the gate electrode 55. Each cell of the diode region 45*d* is formed with a diode structure portion. The diode structure portion is configured to include the cathode region 48, the buffer region 49, the drift region 50, and the base region 51 that functions as an anode.

<Emitter Electrode>

Next, the emitter electrode 42 will be described in detail with reference to FIGS. 4 and 5. In FIG. 4, illustration of the protective film is omitted.

The semiconductor element 40 includes a protective film 56 above the first surface 41*a* of the semiconductor substrate 41. The protective film 56 is an insulating film provided above the first surface 41*a* of the semiconductor substrate 41 so as to cover the peripheral portion of the emitter electrode 42. As a material of the protective film 56, for example, polyimide, a silicon nitride film, or the like can be adopted. The protective film 56 has an opening 561 that defines a bonding region between the emitter electrode 42 and the bonding material 101. The opening 561 is a through hole that penetrates the protective film 56 in the Z direction. Similarly, the protective film 56 has an opening (not shown) that defines a bonding region of the pad 44.

The emitter electrode 42 has an exposed portion 421 exposed from the opening 561 of the protective film 56 to provide the bonding region. The exposed portion 421 forms a bonding portion with the bonding material 101. The emitter electrode 42 has a multilayer structure. The emitter electrode 42 includes a base electrode 422 and a connection electrode 423. The pad 44 also has the same configuration as the emitter electrode 42.

The base electrode 422 is a metal layer formed adjacent to the semiconductor substrate 41 in the emitter electrode 42 of the multilayer structure. The base electrode 422 may be referred to as a bottom electrode, a lower-layer electrode, a wiring electrode, a first metal layer, or the like. The base electrode 422 is connected to the first surface 41*a* of the semiconductor substrate 41. The base electrode 422 is formed using, for example, a material containing aluminum (Al) as a main component. In the present embodiment, an Al alloy such as AlSi or AlSiCu is used as the material.

The base electrode 422 extends over the outer peripheral region 46 while including the active region 45 in the plan view. The base electrode 422 is connected to the emitter region 52 and the base region 51. The base electrode 422 has a peripheral portion 422*a* surrounding the exposed portion 421 in the plan view. The peripheral portion 422*a* is a portion of the base electrode 422 that overlaps with the protective film 56. The protective film 56 is disposed above the first surface 41*a* of the semiconductor substrate 41 so as to cover the peripheral portion 422*a* of the base electrode 422.

The connection electrode 423 is stacked on the base electrode 422 for the purpose of improving the bonding strength with the bonding material 101, improving the wettability with respect to the bonding material 101, and the like. The connection electrode 423 may be also referred to as a top electrode, an upper electrode, an upper-layer electrode, or a second metal layer. The connection electrode 423 includes at least one metal layer. The metal layer constituting the connection electrode 423 includes, for example, any one of nickel (Ni), palladium (Pd), gold (A)u, platinum (Pt), and silver (Ag).

The connection electrode 423 of the present embodiment includes at least a nickel (Ni) layer. Ni is harder than the Al alloy of the base electrode 422. The connection electrode 423 may further include a gold (Au) layer above the Ni layer. The Au layer suppresses oxidation of the Ni layer, for example, and improves wettability with the solder as the bonding material 101. Since Au diffuses into the solder during soldering, the Au layer exists in a state before soldering but does not exist in a soldered state.

The connection electrode 423 is stacked on the base electrode 422 and is exposed from the opening 561. For example, the connection electrode 423 of the present embodiment is disposed above the base electrode 422 in the opening 561. An outer peripheral end portion of the connection electrode 423 is in contact with, for example, a wall surface of the protective film 56 defining the opening 561. The exposed portion 421 of the emitter electrode 42 includes the connection electrode 423 and a portion of the base electrode 422 that overlaps the opening 561 in the plan view. The exposed portion 421 has a substantially rectangular shape as the planar shape.

<Positional Relationship Between Exposed Portion and Active Region>

Next, the positional relationship between the exposed portion 421 of the emitter electrode 42 and the active region 45 will be described with reference to FIG. 4. For convenience, in FIG. 4, the outer peripheral end of the exposed portion 421 of the emitter electrode 42, that is, the opening end of the protective film 56 is indicated by a broken line.

As shown in FIG. 4, the active region 45 includes an overlapping region 451 that overlaps the exposed portion 421 of the emitter electrode 42 in the plan view and a non-overlapping region 452 that does not overlap the exposed portion 421 in the plan view. The overlapping region 451 is a region immediately below the exposed portion 421 in the active region 45. The non-overlapping region 452 is a region outside the exposed portion 421 in the active region 45.

The overlapping region 451 is aligned with the pads 44 in the Y direction. The non-overlapping region 452 is continuous with the overlapping region 451 in the Y direction. That is, the non-overlapping region 452 is aligned with the exposed portion 421 in the Y direction. The non-overlapping region 452 is provided on a side adjacent to the pads 44 with respect to the exposed portion 421. Most of the non-overlapping region 452 is aligned with the pads 44 in the X direction. The non-overlapping region 452 includes a pad beside region 452a that is aligned with the pad 44 in the X direction. The non-overlapping region 452 includes two pad beside regions 452a. The two pad beside regions 452a are provided on both sides of the pad 44 in the X direction so as to interpose the pads 44 therebetween. The Y direction corresponds to a first direction in which the pads 44 and the overlapping region 451 are aligned, and the X direction corresponds to a second direction.

In the present embodiment, the non-overlapping region 452 is entirely the diode region 45d. That is, the IGBT region 45i is not disposed in the non-overlapping region 452. Only the diode structure portion (diode) is formed in the pad beside region 452a. The IGBT structure portions (IGBTs) and the diode structure portions are disposed in the overlapping region 451. In the overlapping region 451, the IGBT regions 45i and the diode regions 45d are alternately arranged at a predetermined pitch in the Y direction which is the arrangement direction of the trenches 53. In the overlapping region 451, the area of each of the IGBT regions 45i is larger than the area of each of the diode regions 45d. That is, the number of cells of each IGBT region 45i is larger than the number of cells of each diode region 45d. The area is defined by an area along the XY plane.

Summary of First Embodiment

As described above, in the present embodiment, the active region 45 includes the overlapping region 451 overlapping with the exposed portion 421 that contributes to the bonding and the non-overlapping region 452. That is, the active region 45 is enlarged to the outside of the exposed portion 421. The proportion of the diode regions 45d in the non-overlapping region 452 is higher than the proportion of the diode regions 45d in the overlapping region 451.

In order for the RC-IGBT to exhibit a desired function, the active region 45 has the IGBT regions 45i and the diode regions 45d at a predetermined ratio. In the present embodiment, the proportion of the IGBT region 45i in the overlapping region 451 is increased by the increase in the proportion of the diode region 45d in the non-overlapping region 452. That is, the heat of the overlapping region 451 where the IGBT structure portions are concentrated, that is, the heat mainly generated by the operations of the IGBTs can be efficiently released from the exposed portion 421 located immediately above to the conductive spacer 80 as a bonding object to be bonded, and further to the heat sink 60.

The amount of heat generation of the diode structure portion is smaller than that of the IGBT structure portion. In the present embodiment, as described above, the proportion of the diode regions 45d in the non-overlapping region 452 is increased. Accordingly, it is possible to suppress the temperature of the non-overlapping region 452 from rising higher than the temperature of the overlapping region 451. That is, it is possible to suppress a situation that the IGBT needs to be turned off due to the temperature rise in the non-overlapping region 452. It is possible to suppress a situation that the current needs to be stopped in the semiconductor device 20 even though the temperature of the overlapping region 451 is not so high. As such, it is possible to flow a large amount of current in the semiconductor device 20 until the temperature of the overlapping region 451 becomes high. As described above, the effect of enlarging the active region can be enhanced.

In the configuration described above, it is possible to suppress an increase in the temperature of the entire active region 45 at the timing when the IGBTs are operated to supply a large amount of current to the motor generator 3, for example, at the time of a heat point operation such as climbing a slope or passing. In addition, since the proportion of the IGBT regions 45i in the overlapping region 451 can be increased and the temperature increase can be suppressed by heat dissipation through the exposed portion 421, it is possible to suppress the decrease in the short-circuit withstand capacity of the IGBTs due to the temperature rising. Further, since the proportion of the diode regions 45d in the non-overlapping region 452 can be increased, the area of the diode regions 45d in the entire active region 45 is secured. As a result, the current density during the diode operation can be reduced, and the occurrence of electromigration can be suppressed.

In the present embodiment, the non-overlapping region 452 includes the pad beside regions 452a arranged side by side with the pads 44 in the X direction, which corresponds to the second direction. In such a configuration, since an empty space besides the pads 44 is effectively used, the active region 45 can be enlarged without changing the area of the semiconductor substrate 41, that is, the chip area.

In the present embodiment, only the diode region 45d is provided in the pad beside region 452a. That is, only the diode structure portion (diode) is formed in the pad beside region 452a. As described above, the amount of heat generation by the diode structure portions is smaller than that by the IGBT structure portions. Therefore, it is possible to suppress the temperature of the non-overlapping region 452 more effectively from rising higher than the temperature of the overlapping region 451.

Second Embodiment

The present embodiment is a modification of the preceding embodiment as a basic configuration and may incorporate description of the preceding embodiment. In the preceding embodiment, only the diode region 45d is provided in the pad beside regions 452a. Alternatively, the IGBT region 45i may be provided in the pad beside regions 452a.

In the pad beside regions 452a, the arrangement of the IGBT regions 45i is not particularly limited. In the configuration in which the pad beside regions 452a includes the IGBT regions 45i, the proportion of the diode regions 45d in the non-overlapping region 452 is higher than the proportion of the diode regions 45d in the overlapping region 451. In the pad beside region 452a, for example, the IGBT regions 45i and the diode regions 45d may be alternately arranged.

Figure 6:
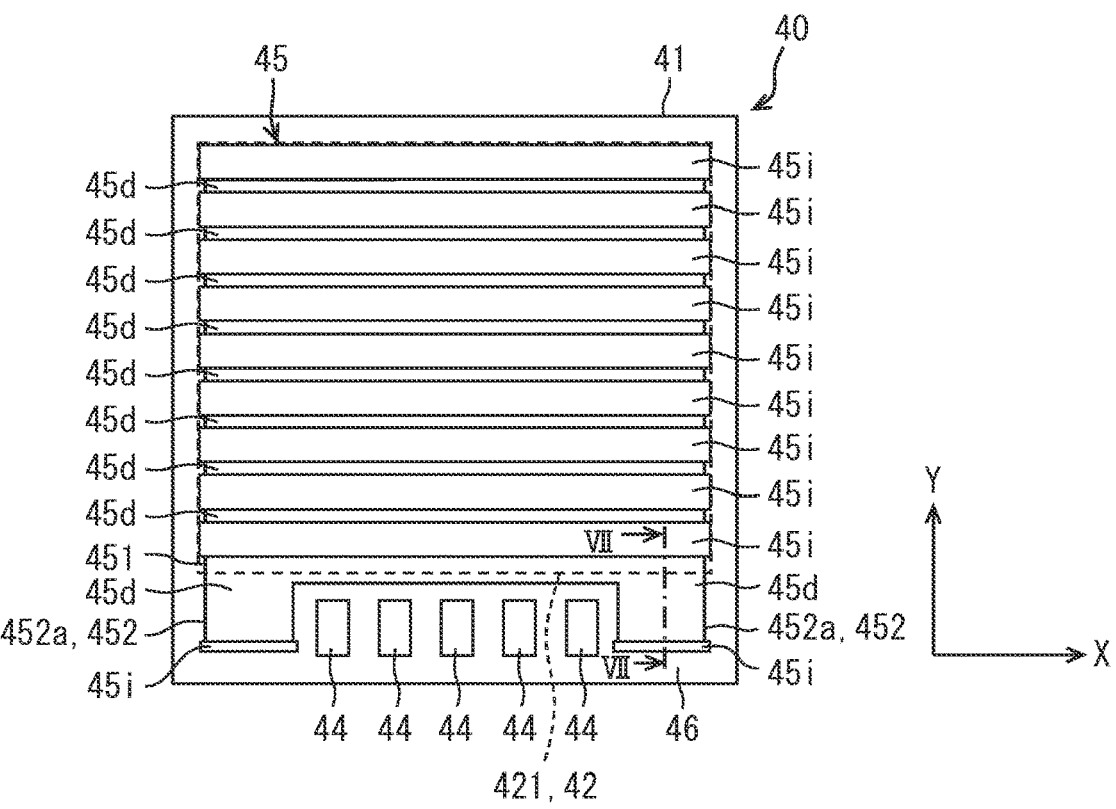
FIG. 6 is a plan view of a semiconductor element of a semiconductor device according to a second embodiment.

FIG. 6 shows an example of the semiconductor element 40 of the semiconductor device 20 according to the present embodiment. FIG. 6 is a plan view corresponding to FIG. 4.

Figure 7:
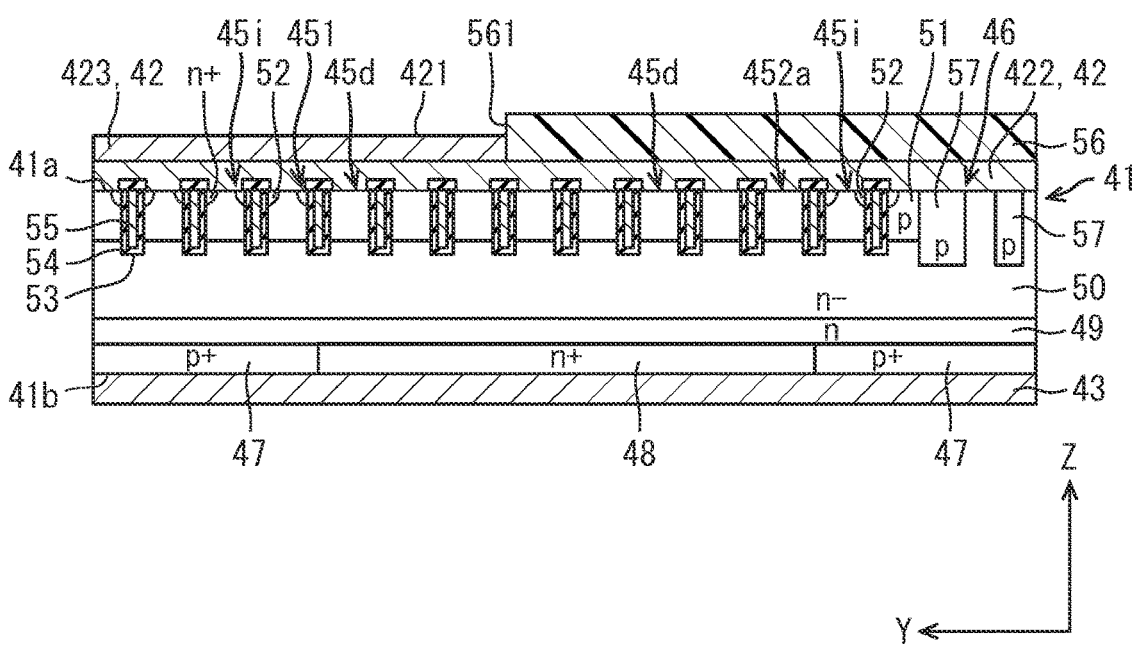
FIG. 7 is a cross-section view taken along a line VII-VII in FIG. 6.

In FIG. 6, similarly to FIG. 4, the outer peripheral end of the exposed portion 421 of the emitter electrode 42 is indicated by a broken line, and the active region 45 including the IGBT regions 45*i* and the diode regions 45*d* is indicated by a solid line. FIG. 7 is a cross-sectional view taken along a line VII-VII in FIG. 6.

In the example shown in FIGS. 6 and 7, the diode regions 45*d* and the IGBT regions 45*i* are provided in the pad beside region 452*a* besides the pads 44. In the pad beside region 452*a*, the IGBT region 45*i* is provided adjacent to an end of the outer peripheral region 46. That is, in the pad beside region 452*a*, the IGBT region 45*i* is provided at an end portion adjacent to the outer peripheral region 46, not at an end portion at a boundary with another region of the active region 45. The IGBT region 45*i* is provided at an end portion facing the guard ring 57 in the pad beside region 452*a*. The trenches 53 (not shown) are arranged in parallel in the Y direction, similarly to the preceding embodiment. In the present embodiment, the IGBT regions 45*i* are provided at ends of the pad beside regions 452*a* in the Y direction, that is, at the end portion of the active region 45 in the Y direction.

For example, as shown in FIG. 7, guard rings 57 are formed in the outer peripheral region 46 of the semiconductor substrate 41. The guard rings 57 causes the depletion layer expanding from the base region 51 to extend along the first surface 41*a* of the semiconductor substrate 41, when a high voltage is applied to the IGBT regions 45*a*, thereby to alleviate the electric field strength and to increase the withstand voltage of the semiconductor device 20. The guard rings 57 are provided so as to surround the active region 45. The number of the guard rings 57 is not particularly limited. The semiconductor device 20 may have at least one guard ring 57. In the example shown in FIG. 7, one of the guard rings 57 is disposed adjacent to an end portion of the base region 51. Another one of the guard rings 57 is disposed at a position away from the guard ring 57 on the inner side. Other configurations of the second embodiment are similar to those described in the preceding embodiment.

Summary of Second Embodiment

When the diode is forward biased, the guard ring 57 has a potential equal to that of the base region 51. Therefore, holes are also supplied from the guard ring 57, which is a p-type semiconductor, to the drift region 50.

In the present embodiment, the IGBT region 45*i* is provided at the end of the pad beside region 452*a*. The diode region 45*d* is separated from the guard ring 57 by the amount corresponding to the IGBT region 45*i* provided at the end portion. Accordingly, when the diode region 45*d* is biased in the forward direction, it is possible to suppress accumulation of a large number of holes in the drift region 50 near the boundary between the pad beside region 452*a* and the outer peripheral region 46. Therefore, when the diode region 45*d* is switched to a reverse biased state, it is possible to suppress a large number of holes from flowing into the base region 51 functioning as the anode, that is, it is possible to suppress the occurrence of local current concentration. Therefore, the recovery capacity of the diode can be improved. According to the present embodiment, it is possible to enhance the effect of enlarging the active region while improving the recovery capacity.

As shown in FIG. 6, in the present embodiment, the IGBT region 45*i* is disposed also at the end of the active region 45 on the side opposite to the pad 44 in the Y direction. Also in this configuration, the recovery capacity of the diode can be improved. Further, in the X direction, the end of the diode region 45*d* is positioned on the inner side than the end of the IGBT region 45*i*. Also in this configuration, the recovery capacity of the diode can be improved. In this way, the recovery capacity of the diode can be improved also in the overlapping region 451. As shown in FIG. 4, the preceding embodiment has the same configuration. Therefore, the similar effects can also be achieved.

The example in which the IGBT region 45*i* is provided at the end of the pad beside region 452*a* in the Y direction has been described. However, the present disclosure is not limited to the example described above. For example, the IGBT region 45*i* may be provided at an end portion on the side opposite to the pad 44 in the X direction. The IGBT regions 45*i* may be provided at both the end portion in the Y direction and the end portion in the X direction.

The withstand voltage structure of the outer peripheral region 46 is not limited to the guard ring 57 described above. The withstand voltage structure may be a structure including a p-type semiconductor region that has the same potential as the base region 51 when the diode is biased in the forward direction. For example, the withstand voltage structure may include a RESURF structure. In this case, the p-type semiconductor region is formed in the surface layer of the drift region 50 in the outer peripheral region 46. The semiconductor region extends outward from the base region 51. Even in such a RESURF structure, by providing the IGBT region 45*i* at the end of the pad beside region 452*a*, it is possible to enhance the effect of enlarging the active region while improving the recovery capacity. RESURF is an abbreviation for Reduced Surface Electric Field.

Third Embodiment

The present embodiment is a modification of the preceding embodiments as a basic configuration and may incorporate description of the preceding embodiments. In the preceding embodiments, the non-overlapping region 452 is disposed so as to be continuous with the end portion of the overlapping region 451, the end portion being adjacent to the pads 44. Alternatively, the non-overlapping region 452 may be disposed so as to be aligned with the exposed portion 421.

Figure 8:
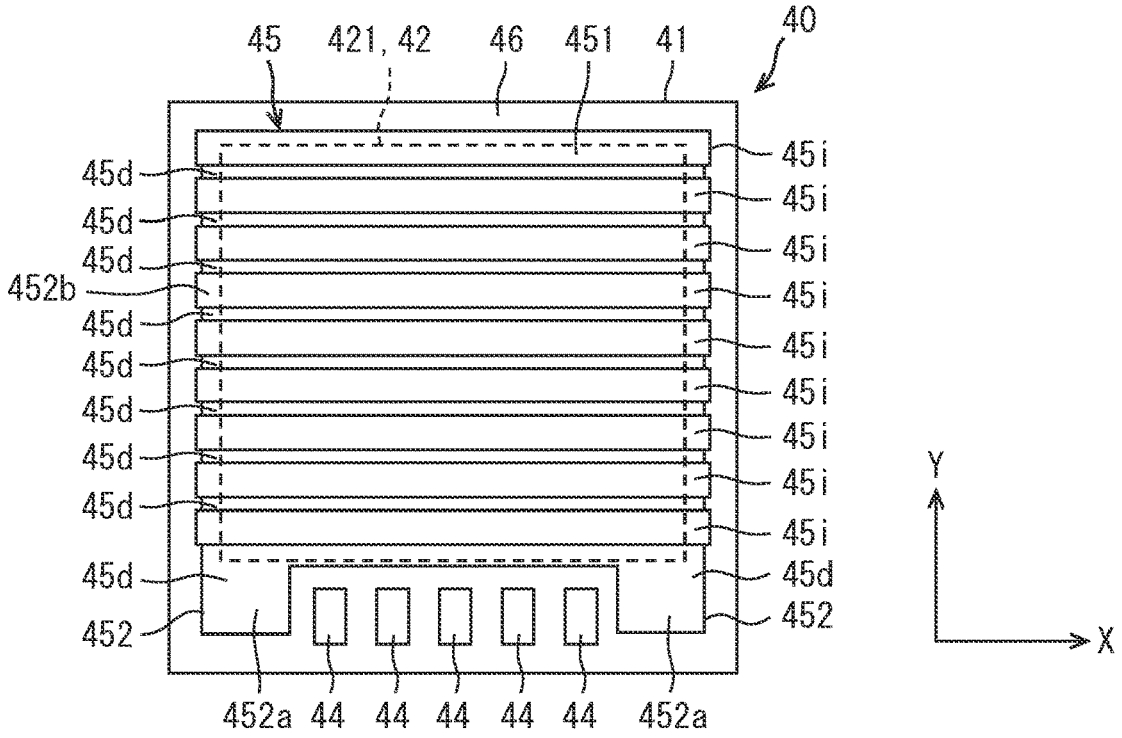
FIG. 8 is a plan view of a semiconductor element of a semiconductor device according to a third embodiment.

FIG. 8 shows the semiconductor element 40 of the semiconductor device 20 according to the present embodiment. FIG. 8 is a plan view corresponding to FIG. 4. In FIG. 8, similarly to FIG. 4, the outer peripheral end of the exposed portion 421 of the emitter electrode 42 is indicated by a broken line, and the active region 45 including the IGBT regions 45*i* and the diode regions 45*d* is indicated by a solid line.

As shown in FIG. 8, the IGBT region 45*i* extends across the exposed portion 421 in the X direction. The diode region 45*d* also extends across the exposed portion 421 in the X direction. The non-overlapping region 452 includes an exposed portion beside region 452*b* that is adjacent to and aligned with the exposed portion 421 in the X direction. In the non-overlapping region 452, the pad beside region 452*a* may be referred to as a first region, and the exposed portion beside region 452*b* may be referred to as a second region. The exposed portion beside region 452*b* is provided on both sides of the exposed portion 421 in the X direction. Similarly to the preceding embodiment, the non-overlapping region 452 includes the pad beside regions 452*a* beside the pads 44 in the X direction. The non-overlapping region 452 further includes the region that is disposed outside the exposed portion 421 in the Y direction excluding the pad beside regions 452a. Other configurations of the present embodiment are similar to those of the preceding embodiments.

Summary of Third Embodiment

In the exposed portion beside region 452b, the ratio of the IGBT regions 45i and the diode regions 45d is substantially the same as that in the overlapping region 451. That is, the proportion of the diode regions 45d in the pad beside region 452a is higher than the proportion of the diode regions 45d in the exposed portion beside region 452b. Accordingly, the proportion of the diode regions 45d in the entire non-overlapping region 452 is higher than the proportion of the diode regions 45d in the overlapping region 451. Therefore, it is possible to enhance the effect of enlarging the active region, while ensuring the area of the active region 45 by enlarging the active region 45 around the exposed portion 421.

The configuration described in the present embodiment can be combined with any of the configuration of the first embodiment and the configuration of the second embodiment.

Fourth Embodiment

The present embodiment is a modification of the preceding embodiments as a basic configuration and may incorporate description of the preceding embodiments. In the preceding embodiments, it has not been particularly mentioned about a temperature sensitive diode that detects the temperature of the semiconductor element 40. However, in the configuration having the pad beside region 452a, the temperature sensitive diode may be provided at a predetermined position. In the preceding embodiment, the pads 44 are provided near the center of the side of the semiconductor substrate 41 in the X direction. Alternatively, the pads 44 may be collectively disposed adjacent to one end in the X direction.

Figure 9:
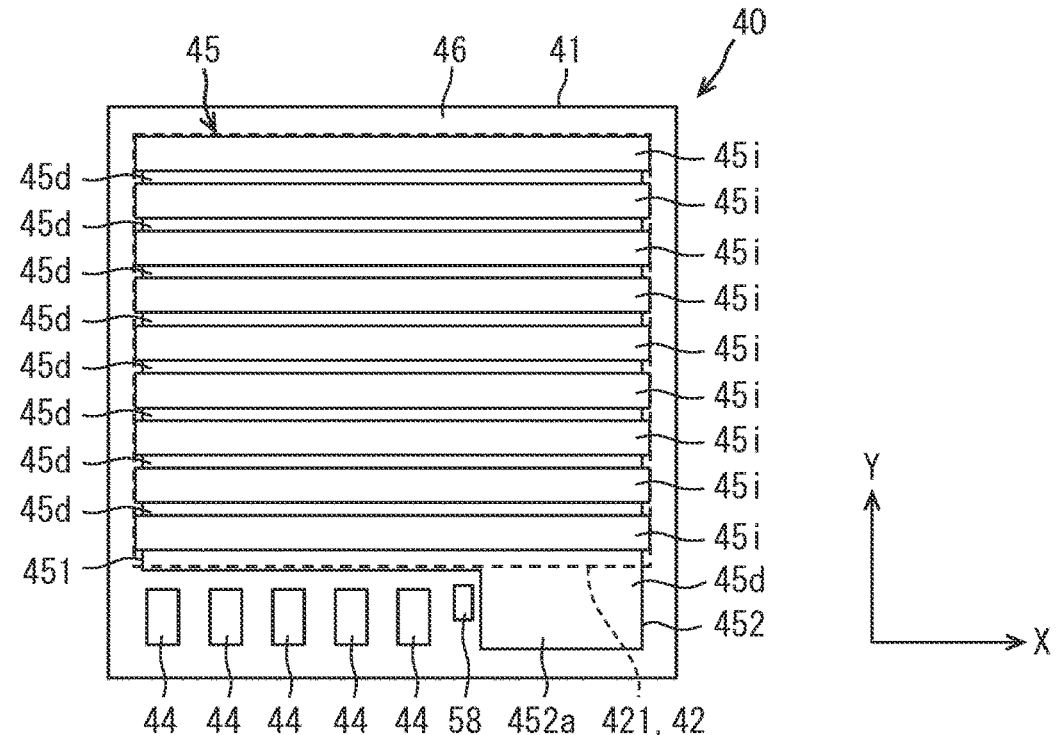
FIG. 9 is a plan view of a semiconductor element of a semiconductor device according to a fourth embodiment.

FIG. 9 shows the semiconductor element 40 of the semiconductor device 20 according to the present embodiment. FIG. 9 is a plan view corresponding to FIG. 4. In FIG. 9, similarly to FIG. 4, the outer peripheral end of the exposed portion 421 of the emitter electrode 42 is indicated by a broken line, and the active region 45 including the IGBT regions 45i and the diode regions 45d is indicated by a solid line.

As shown in FIG. 9, the multiple pads 44 are collectively arranged adjacent to one end in the X direction. The multiple pads 44 are arranged to be biased in the X direction. The pad beside region 452a is provided at an end opposite to the arrangement region of the pads 44 in the X direction. In this case, the active region 45 includes only one pad beside region 452a. The active region 45 including the pad beside region 452a has a substantially L-shape in the plan view.

The semiconductor element 40 includes a temperature sensitive diode 58. The temperature sensitive diode 58 is configured to include an aluminum based wiring material containing polysilicon doped with an impurity. The temperature sensitive diode 58 is provided on the first surface 41a of the semiconductor substrate 41. The temperature sensitive diode 58 is disposed not at a position overlapping the active region 45 in the plan view but between the pads 44 and the pad beside region 452a in the X direction. The anode of the temperature sensitive diode 58 is electrically connected to the anode pad 44, and the cathode of the temperature sensitive diode 58 is electrically connected to the cathode pad 44. Other configurations of the present embodiment are similar to those of the preceding embodiments.

Summary of Fourth Embodiment

As described above, in the present embodiment, the temperature sensitive diode 58 is disposed outside the active region 45. Accordingly, it is possible to increase the area of the exposed portion 421 and to improve heat dissipation. That is, even when the proportion of the IGBT regions 45i is increased in the overlapping region 451 immediately below the exposed portion 421, the heat can be efficiently released.

The pad beside region 452a is outside the exposed portion 421, and is less likely to dissipate the heat through the exposed portion 421, as compared with the overlapping region 451. In the present embodiment, the temperature sensitive diode 58 is disposed between the pads 44 and the pad beside region 452a. That is, the temperature sensitive diode 58 is provided in the vicinity of the pad beside region 452a. In the vicinity of the pad beside region 452a, the temperature is relatively high in the region outside the exposed portion 421. Therefore, it is possible to detect the temperature of the semiconductor element 40 while providing the temperature sensitive diode 58 outside the active region 45. In addition, it is possible to shorten a wiring connecting the temperature sensitive diode 58 and the pad 44.

The configuration described in the present embodiment can be combined with any of the configuration of the first embodiment, the configuration of the second embodiment, and the configuration of the third embodiment.

As described above, in the configuration in which the pads 44 are disposed to be biased to the one end in the X direction and the pad beside region 452a is disposed adjacent to the other end, the temperature sensitive diode 58 may be provided at a position overlapping with the active region 45, for example, the overlapping region 451 in the plan view. The temperature sensitive diode 58 may be provided between the pads 44 and the pad beside region 452a in the configuration in which the pads 44 are provided near the center of the side of the substantially rectangular semiconductor element 40 as in the preceding embodiment.

Other Embodiments

The present disclosure in the specification, the drawings and the like is not limited to the embodiments exemplified hereinabove. The present disclosure encompasses the exemplified embodiments and modifications thereof by those skilled in the art based thereon. For example, the present disclosure is not limited to the combinations of components and/or elements shown in the embodiments. The present disclosure may be implemented in various combinations. The present disclosure may have additional parts that may be added to the embodiments. The present disclosure encompasses modifications in which components and/or elements are omitted from the embodiments. The present disclosure encompasses the replacement or combination of components and/or elements between one embodiment and another. The technical scopes disclosed in the present disclosure are not limited to the description of the embodiments. It should be understood that part of disclosed technical scope is indicated by recitation of claims, and includes every modification within the equivalent meaning and the scope of recitation of claims.

The disclosure in the specification, the drawings, and the like is not limited by the description of the claims. The disclosure in the specification, the drawings, and the like encompasses the technical ideas described in the claims, and further extends to a wider variety of technical ideas than those in the claims. Therefore, various technical ideas can be extracted from the disclosure of the specification, the drawings and the like without being limited to the description of the claims.

When an element or a layer is described as "disposed above", "coupled to" "connected to" or "combined with", the element or the layer may be directly disposed above, coupled to, connected to, or combined with another element or another layer, or an intervening element or an intervening layer may be present therebetween. In contrast, when an element is described as "directly disposed on," "directly coupled to," "directly connected to", or "directly combined with" another element or another layer, there are no intervening elements or layers present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "rear", "bottom", "low", "top", "high", and the like are used herein to facilitate the description that describes relationships between one element or feature and another element or feature. Spatial relative terms can be intended to include different orientations of a device in use or operation, in addition to the orientations illustrated in the drawings. For example, when a device in a drawing is turned over, elements described as "below" or "directly below" other elements or features are oriented "above" the other elements or features. Therefore, the term "below" can include both above and below. The device may be oriented in another direction (rotated 90 degrees or in any other direction) and the spatially relative terms used herein are interpreted accordingly.

The vehicle drive system 1 is not limited to the structure of the embodiments described above. Although the vehicle drive system 1 having one motor generator 3 has been exemplified, the present disclosure is not limited to thereto. The vehicle drive system 1 may have two or more motor generators. Although the exemplified electric power conversion device 4 has the inverter 6 as the power converter, the configuration of the electric power conversion device 4 is not limited thereto. For example, the electric power conversion device 4 may have multiple inverters. As another example, the electric power conversion device 4 may have at least one inverter and at least one converter. As further another example, the electric power conversion device 4 may have only the converter.

The configuration of the semiconductor device 20 is not limited to the above example. The semiconductor device 20 may include at least the semiconductor element 40.

The configuration in which the back surfaces 60b and 70b of the heat sinks 60 and 70 are exposed from the sealing resin body 30 has been exemplified, the present disclosure is not limited to such a configuration. At least one of the back surfaces 60b and 70b may be covered with the sealing resin body 30. At least one of the back surfaces 60b and 70b may be covered with another insulating member (not shown) different from the sealing resin body 30. The semiconductor device 20 having the sealing resin body 30 has been exemplified, the present disclosure is not limited thereto. The semiconductor device 20 may not have the sealing resin body 30.

The semiconductor device 20 having the heat sink 60 and the conductive spacer 80 as the first wiring member connected to the emitter electrode 42 as the first main electrode and the heat sink 70 as the second wiring member connected to the collector electrode 43 as the second main electrode has been exemplified. However, the wiring members are not limited to the example described above. For example, a substrate in which metal bodies are disposed on both surfaces of an insulating base material may be employed, instead of the heat sinks 60 and 70. An example of the substrate is a direct bonded copper (DBC) substrate. Instead of the conductive spacer 80, the heat sink 60 may have a protrusion. Similarly, the metal body on the inner surface side of the substrate may have a protrusion.

The semiconductor device 20 having the double-sided heat dissipation structure has been exemplified. However, the present disclosure is not limited thereto. The present disclosure can also be applied to a semiconductor device having a single-sided heat dissipation structure. For example, the collector electrode 43 may be connected to a metal body of a heat sink or a substrate, and the emitter electrode 42 may be connected to a lead.

The semiconductor device 20 having only one semiconductor element 40 constituting one arm has been exemplified. However, the present disclosure is not limited thereto. The semiconductor device 20 may include a plurality of semiconductor elements 40 constituting one arm. That is, a plurality of semiconductor elements 40 may be connected in parallel to each other to form one arm. The semiconductor device 20 may include a plurality of semiconductor elements 40 constituting the upper-lower arm circuit 9 for one phase. The semiconductor device 20 may include a plurality of semiconductor elements 40 constituting upper-lower arm circuits 9 for a plurality of phases.

The configuration in which the opening 561 has the substantially rectangular shape that is, the exposed portion 421 has the rectangular shape as the planar shape has been exemplified. However, the present disclosure is not limited thereto. The active region 45 includes the overlapping region 451 and the non-overlapping region 452 regardless of the shape of the exposed portion 421.

The number of pads 44 is not particularly limited. The semiconductor element 40 may include at least one pad 44. The pad 44 may include at least a pad for the gate electrode 55.

The arrangement of the trenches 53 (gate electrodes 55) is not limited to the stripe shape described above. The arrangement of the IGBT regions 45i and the diode regions 45d is not limited to the alternate arrangement in the Y direction as described above.

Figure 10:
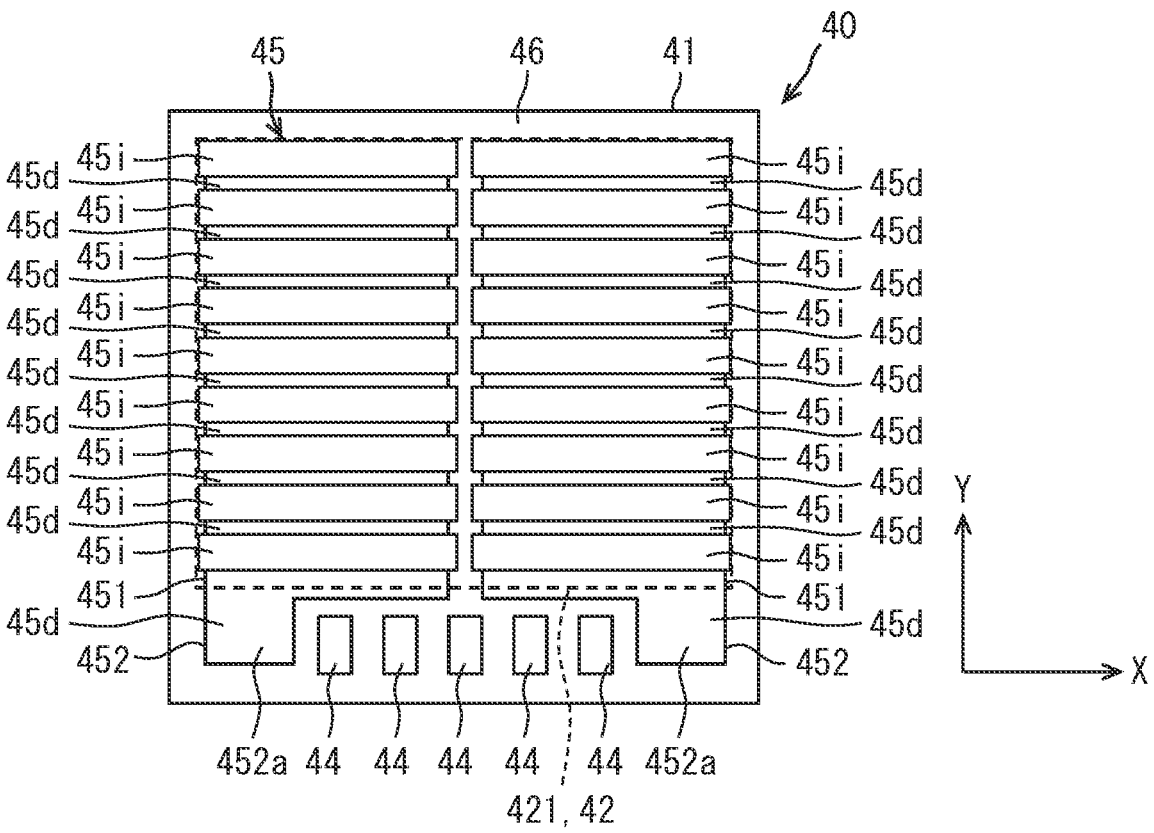
FIG. 10 is a plan view of a semiconductor element according to a modification.

The active region 45 may be divided into a plurality of regions. For example, in an example shown in FIG. 10, the active region 45 is divided into two regions in the X direction. A gate runner, that is, a gate wiring (not shown) is disposed between the active regions 45. The gate runner electrically connects the gate electrode 55 and the pad 44 for the gate electrode. FIG. 10 is a plan view corresponding to FIG. 4.

Although the example in which the non-overlapping region 452 includes the pad beside region 452a has been exemplified, the present disclosure is not limited thereto. The semiconductor element 40 may not have the pad beside region 452a. The proportion of the diode regions 45d may be increased at a position other than the pad beside region 452a.

What is claimed is:

1. A semiconductor device comprising:

a semiconductor substrate having a first surface and a second surface opposite to the first surface in a thickness direction;

a protective film disposed above the first surface of the semiconductor substrate, the protective film defining an opening;

a first main electrode disposed on the first surface of the semiconductor substrate, the first main electrode having an exposed portion exposed from the opening of the protective film to provide a bonding region; and a second main electrode disposed on the second surface of the semiconductor substrate, wherein the semiconductor substrate includes an active region formed with a plurality of IGBTs to each of which a diode is connected in antiparallel, as vertical elements that allow currents to flow between the first main electrode and the second electrode, the opening is disposed to correspond to the active region in the thickness direction, the active region includes an overlapping region that overlaps with the exposed portion of the first main electrode in the thickness direction, and a non-overlapping region that does not overlap with the exposed portion in the thickness direction, and a proportion of a diode-formed region in the non-overlapping region is higher than a proportion of a diode-formed region in the overlapping region.

2. The semiconductor device according to claim 1, wherein the semiconductor substrate includes a pad disposed on the first surface of the semiconductor substrate as a signal electrode, the pad and the overlapping region are arranged side by side in a first direction orthogonal to the thickness direction, and the non-overlapping region includes a pad-beside region besides the pad in a second direction that is orthogonal to the first direction and the thickness direction.

3. The semiconductor device according to claim 2, wherein the pad-beside region is provided only with the diode.

4. The semiconductor device according to claim 2, wherein the semiconductor substrate includes an outer peripheral region surrounding the active region in a plan view along the thickness direction, the pad-beside region is provided with at least one diode and at least one IGBT, and in the pad-beside region, the at least one IGBT is located at an end adjacent to the outer peripheral region.

5. The semiconductor device according to claim 2, wherein the non-overlapping region includes the pad-beside region and an exposed portion-beside region besides the exposed portion, and a proportion of a diode-formed region in the pad-beside region is higher than a proportion of a diode-formed region in the exposed portion-beside region.

6. The semiconductor device according to claim 2, further comprising:

a temperature sensitive diode disposed between the pad and the pad-beside region.

7. The semiconductor device according to claim 1, further comprising:

a first wiring member electrically connected to the first main electrode; and a second wiring member electrically connected to the second main electrode.

* * * * *